(12) United States Patent
Sucher

(10) Patent No.: US 8,753,961 B2
(45) Date of Patent: Jun. 17, 2014

(54) THERMAL BUDGET OPTIMIZATION FOR YIELD ENHANCEMENT ON BULK SILICON WAFERS

(75) Inventor: Bradley David Sucher, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/347,397

(22) Filed: Jan. 10, 2012

(65) Prior Publication Data

US 2012/0178240 A1    Jul. 12, 2012

Related U.S. Application Data

(60) Provisional application No. 61/431,251, filed on Jan. 10, 2011.

(51) Int. Cl.
*H01L 21/322*    (2006.01)

(52) U.S. Cl.
USPC ............. 438/471; 257/E21.318; 257/E21.12; 257/E21.461; 257/E21.09; 257/631

(58) Field of Classification Search
USPC ........................ 438/71, 486, 478, 492, 689
See application file for complete search history.

(56) References Cited

U.S. PATENT DOCUMENTS

| | | | | |
|---|---|---|---|---|
| 5,976,956 | A  * | 11/1999 | Gardner et al. | 438/473 |
| 2005/0032337 | A1 * | 2/2005 | Wilson et al. | 438/476 |
| 2005/0253221 | A1 * | 11/2005 | Takase et al. | 257/607 |

\* cited by examiner

*Primary Examiner* — Chuong A Luu
*Assistant Examiner* — Rodolfo Fortich
(74) *Attorney, Agent, or Firm* — Wade J Brady, III; Frederick J. Telecky, Jr.

(57) ABSTRACT

A method of nucleating and growing oxygen precipitates during a pad oxidation process. The nucleating is performed during in the oxidation furnace prior to the pad oxide growth. At least a portion of the growth of the oxygen precipitates occurs during the pad oxide growth. The oxygen precipitates are of sufficient concentration and size in lightly doped p-type wafers for effective gettering of heavy metals is deep submicron transistor, integrated circuit manufacturing flows.

13 Claims, 4 Drawing Sheets

THERMAL BUDGET OPTIMIZATION FOR YIELD ENHANCEMENT ON BULK SILICON WAFERS

This application claims the benefit of U.S. Provisional Application No. 61/431,251, filed Jan. 10, 2011, the entirety of which is herein incorporated by reference.

FIELD OF THE INVENTION

This invention relates to the field of integrated circuits. More particularly, this invention relates to the optimization of gettering during wafer processing.

BACKGROUND OF THE INVENTION

Contamination of silicon wafers with heavy metals such as Fe, Mg, Ca, Ni, Cu, etc. may result in depressed yield and in reduced reliability. The heavy metal atoms may be incorporated in the transistor gate dielectric during growth resulting in poor gate oxide integrity or in premature wearout of the gate dielectric. Heavy metal ions may also prevent silicon defects from healing during anneal steps resulting in increased diode leakage. One method of removing heavy metal contaminants from the critical active areas near the surface of integrated circuit wafers is to grow bulk micro defects (BMD) beneath a denuded surface layer. Heavy metal atoms diffuse to and get trapped (gettered) by the BMDs thus removing them from regions where they may cause harm.

BMD's nucleate and grow during thermal steps in integrated circuit process flows. Here to fore semiconductor process flows have sufficient thermal budget (temperature multiplied by time at temperature) in the process flow to nucleate and grow BMDs for efficient gettering. Recently, the thermal budget of some ultra deep submicron process flows is no longer sufficient to grow microdefects (BMDs) of an adequate concentration and size for effective gettering. Poor gettering may result in depressed yield. The wafer shown in FIG. 1 has poor yield at the edges of the wafer, 1002, as a result of poor gettering in the edge of the wafer.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

Optimized BMD nucleation and growth steps are performed early in the semiconductor manufacturing flow to grow BMD's to a sufficient concentration and size for efficient gettering. The BMD nucleation and growth anneals are performed early in the manufacturing flow to avoid driving dopants which otherwise may degrade performance of ultradeep submicron transistors

DETAILED DESCRIPTION

Figure 1:
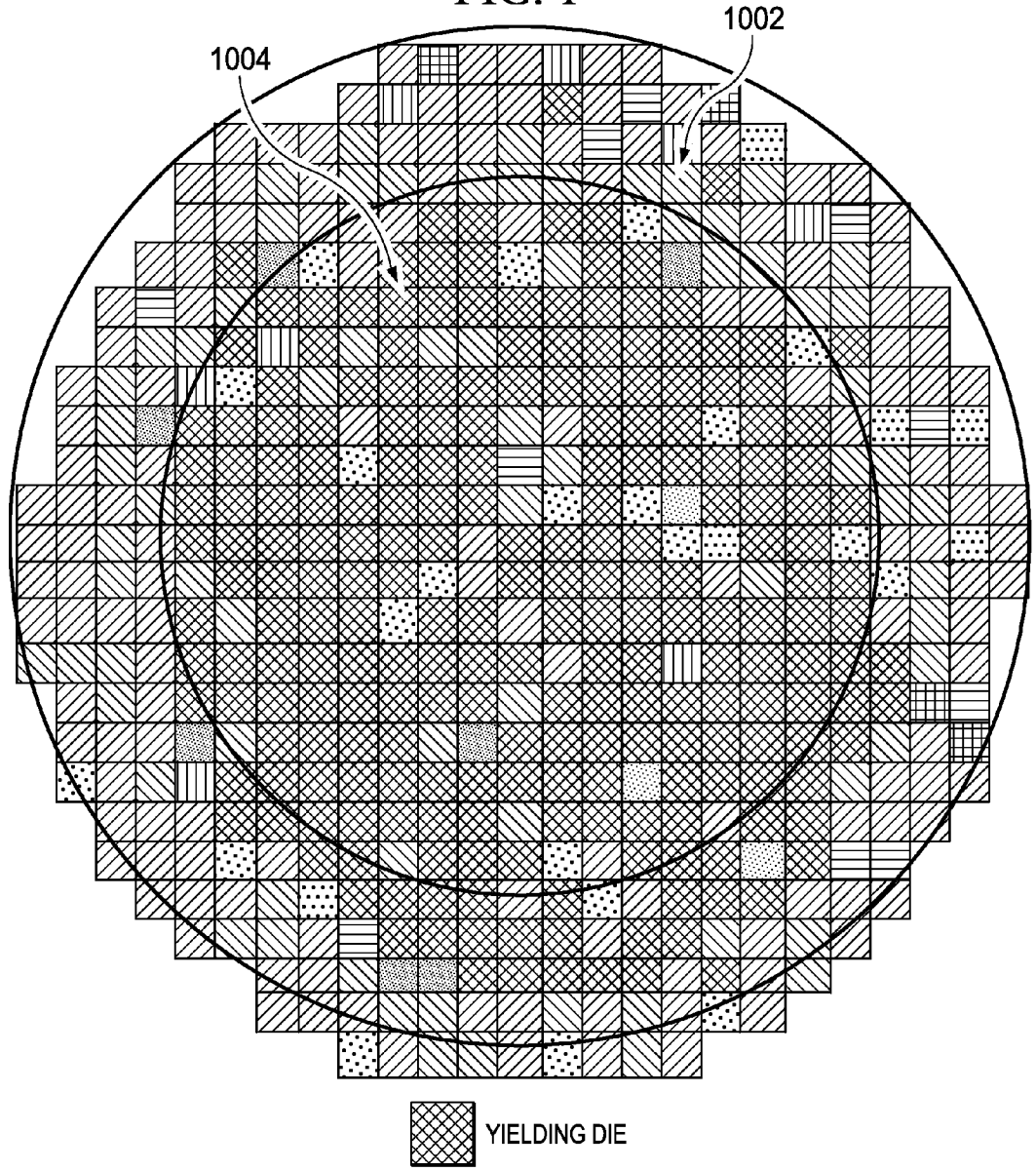
FIG. 1 (Prior art) is the yield map of a wafer with insufficient gettering on the edge of the wafer.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Many CMOS integrated circuits are manufactured on p-wafers or on a p-type substrate with a p-epitaxial layer (P/P-substrate). For example a p-type substrate may have a resistivity of 1.5 to 15 ohm-cm and the p-epitaxial layer may have a resistivity of 10-15 ohm-cm and may be 2.8 to 3.2 um thick or the p-epitaxial layer may be approximately 3.0 um thick with a resistivity of 1.6 to 2.2 ohm-cm. The thermal budget (temperature multiplied by time at temperature) of semiconductor manufacturing flows has been decreasing as transistors are scaled to smaller and smaller dimensions to prevent short channel effects that may be caused by dopants diffusion at high temperatures. Until recently, integrated circuit manufacturing flows utilizing P/P-substrates had adequate thermal budget to allow a sufficient concentration of oxygen precipitates to nucleate and grow forming BMDs with a concentration and size having efficient gettering of heavy metal ions. Heavy metal ions such as Fe, Mg, Mn, Ni, and Cu if not gettered from the device regions may be incorporated in the gate dielectric during gate oxidation causing gate dielectric failure or premature dielectric wearout or may cause pinning of silicon defects resulting in excessive diode leakage.

A P/P-substrate wafer with insufficient gettering at the wafer edges is shown in FIG. 1. Area 1004 at the center of the wafer has adequate gettering as indicated by the high die yield. Area 1002 at the edge of the wafer has almost zero yield due to inadequate gettering for heavy metal atoms.

To improve the gettering, an optimized oxygen precipitation nucleation growth step plus an optimized oxygen precipitation growth step may be added early in the process flow. For efficient gettering it is desirable to have an oxygen precipitate (BMD) concentration of greater than about $1E9/cm^3$ and with a BMD size of greater than about 5 nm to 10 nm depending upon the heavy metal species being gettered.

Figure 3:
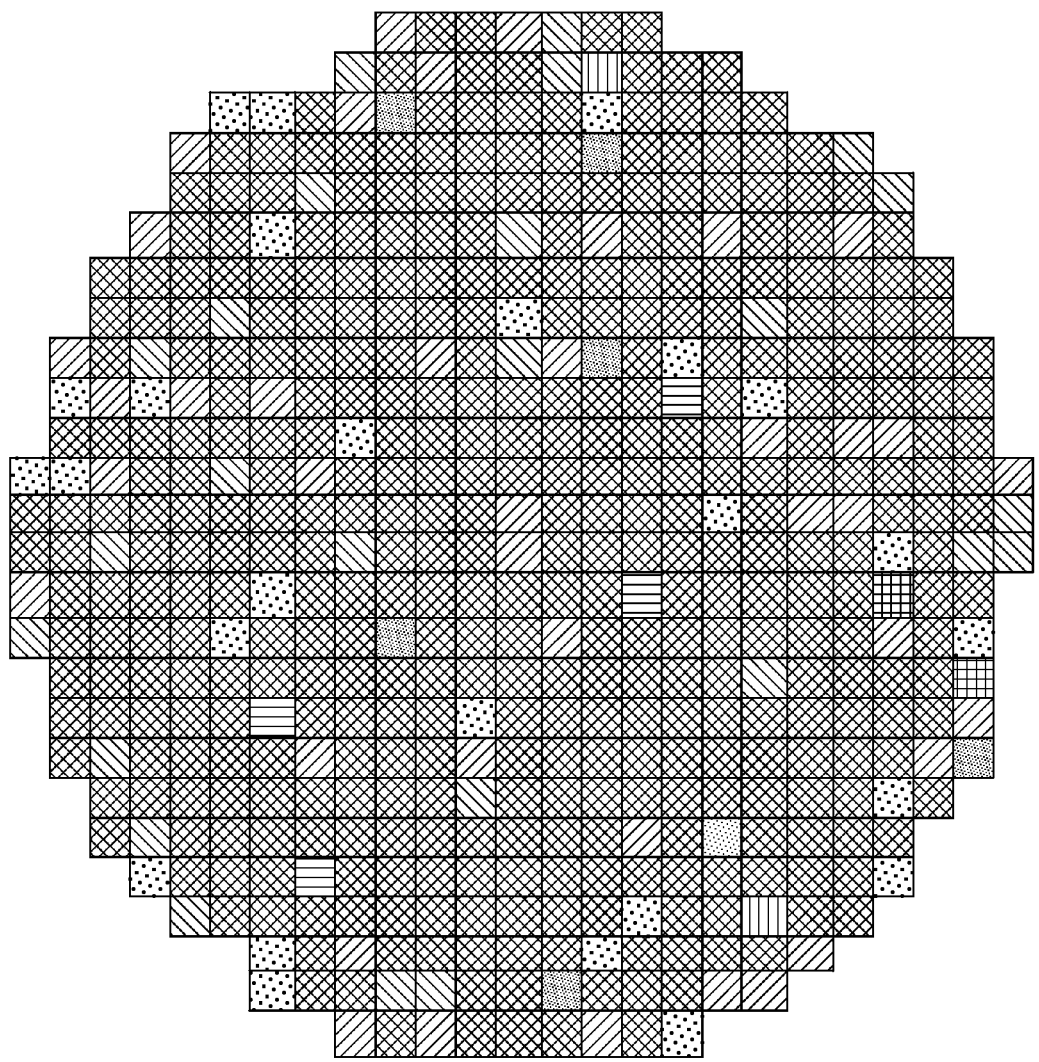
FIG. 3 is a yield map of a wafer with BMD nucleation and growth steps according to an embodiment.

FIG. 3 is a wafer processed in the same lot as the wafer shown in FIG. 1 with the addition of an embodiment method of gettering enhancement. The yield has been significantly improved by the embodiment process as shown in FIG. 3.

Figure 5:
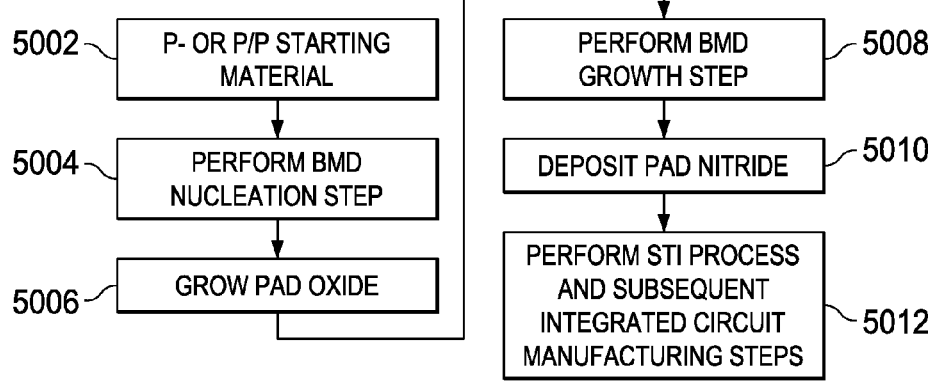
FIG. 5 is a flow diagram of an embodiment process flow.

An embodiment process flow in which BMD nucleation and BMD growth steps are incorporated with the STI pad oxidation manufacturing step is described in FIG. 5. The process flow starts in step 5002 with a lightly p-type doped substrate (P-) or with lightly p-type doped epitaxial silicon on p-type substrate. The P- or P/P-substrates preferably may contain approximately 24-28 pmma oxygen and 1E13-1E14/ cm³ nitrogen. Resistivity of the P-wafers or the P-epi may be in the range of approximately 1.5-15 ohm-cm or more preferably in the range of 10-15 ohm-cm.

After cleaning the surface a BMD nucleation step may be performed in step 5004 by annealing the wafer at a temperature in the range of 550° C. to 750° C. for a time in the range of 30 minutes to 120 minutes. For example, a nucleation step may be performed for 30 minutes at 750° C. or for 120 minutes at 550° C. In a preferred embodiment, the wafers are annealed at 650° C. for 120 minutes in an inert ambient such as nitrogen or argon or diluted oxygen ambient. For example nitrogen plus <10% oxygen.

Figure 2:
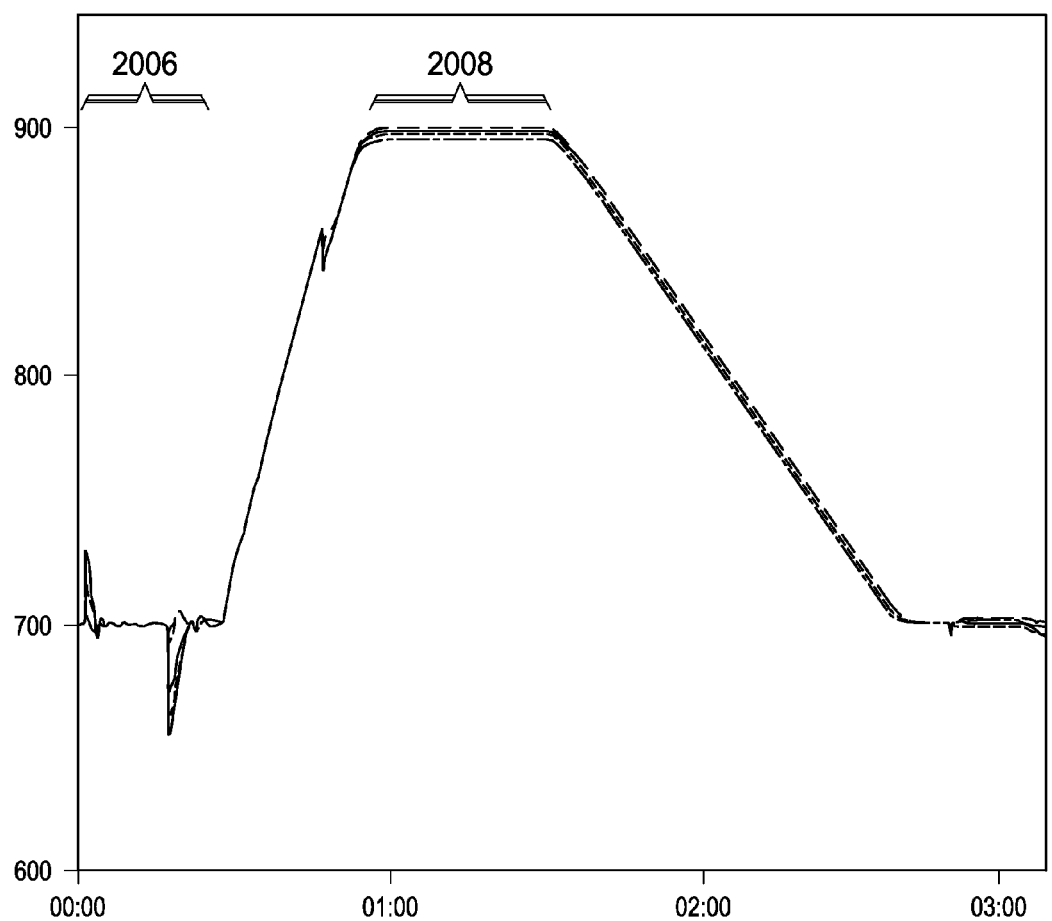
FIG. 2 (Prior art) is an example prior art temperature versus time plot.

A typical STI pad oxidation plot of temperature vs. time is shown in FIG. 2. In a typical STI pad oxidation manufacturing step, as soon as the wafers have been fully loaded into the furnace and the wafer temperature stabilized at 700° C. and the furnace ambient stabilized (step 2006), the wafers are ramped to the oxidation temperature which in this instance is 900° C. The time during step 2006 in a typical STI oxidation step is too short for an adequate number of oxygen precipitates to form. In the embodiment example shown in FIG. 4, the stabilization step temperature is reduced to 650° C. and the stabilization step duration is extended to 120 minutes to form a sufficient number of oxygen precipitates to form for effective gettering.

In step 5006 pad oxide is grown at a temperature in the range of 850° C. to 1000° C. The nucleated BMDs also grow in size during the pad oxidation step. However, they may not grow to a sufficient size for effective gettering depending upon the time and temperature of the pad oxidation step.

A typical pad oxidation growth step 2008 is shown in FIG. 2. The time which is about 35 min. at 900° C. does not grow the oxygen precipitates (BMDs) to sufficient size to effectively getter heavy metal ions.

After the pad oxide is grown in step 5006, the wafer may be additionally annealed in an inert or diluted oxygen ambient such as nitrogen plus <10% oxygen to grow the BMDs to a size that is large enough for effective gettering of heavy metal atoms. The size of the BMDs may be grown to greater than about 5 to 10 nm depending upon the species of heavy metal being gettered. The BMD growth step, including the pad oxidation time and temperature, may be performed at a temperature in the range of 800° C. to 1000° C. and for a time in the range of 30 minutes to 120 minutes. For example, the BMD growth step may be performed at 1000° C. for 30 minutes or at 800° C. for 120 minutes.

Figure 4:
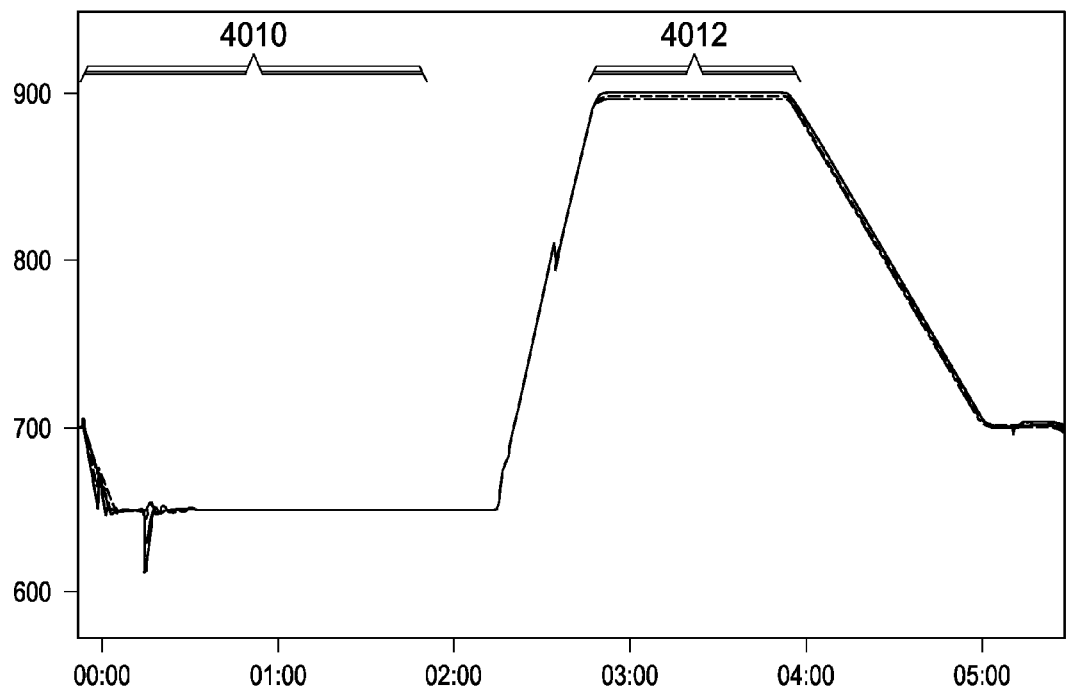
FIG. 4 is an example temperature versus time plot for BMD nucleation and growth steps according to an embodiment.

In an example embodiment shown in FIG. 4 a combination pad oxidation/BMD growth step 4012 is performed in an oxygen atmosphere diluted with an inert gas for about 60 minutes at a temperature of 900° C. This combined STI pad oxidation/BMD growth step provides sufficient time at a high enough temperature to grown the BMDs that nucleated in step 4010 to a size that is large enough for effective gettering.

Following the BMD growth step 5008, the pad nitride used for shallow trench isolation (STI) process may be deposited. This nitride is typically deposited using an LPCVD process. As shown in step 5012, additional processing may then be performed to build the transistors and other components and to build the interconnection layers needed to complete the integrated circuit.

Incorporating the BMD nucleation and growth steps in the pad oxidation step at the beginning of the semiconductor processing, provides efficient gettering without causing short channel effects while building the deep submicron transistors. Although the preferred embodiment is to incorporate the BMD nucleation and growth steps in the initial STI pad oxidation step, the BMD nucleation and growth steps may be performed at another process step in the manufacturing flow prior to the core transistor extension or LDD implants. After the extension implants the temperature required to grow the BMD's might cause the extension dopants to diffuse causing short channel effects which degrade the core transistors.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing an integrated circuit, comprising:
   providing a lightly doped p-type substrate having a resistivity in the range of 1.5-15 ohm-cm;
   loading said lightly doped p-type substrate into an oxidation furnace;
   performing an oxygen precipitate nucleation step prior to an oxygen precipitate growth step with a temperature in the range of 550° C. to 750° C. for a time in the range of 30 minutes to 180 minutes on said lightly doped p-type substrate while said lightly doped p-type substrate is in said oxidation furnace;
   growing a layer of pad oxide for a shallow trench isolation (STI) process on said lightly doped p-type substrate while said lightly doped p-type substrate is in said oxidation furnace;
   performing said oxygen precipitate growth step on said lightly doped p-type substrate while said lightly doped p-type substrate is in said oxidation furnace with a temperature in the range of 850° C. to 1000° C. for a time in the range of 30 minutes to 120 minutes, at least a portion of said oxygen precipitate growth step being concurrent with said step of growing said layer of pad oxide; and
   forming a layer of pad nitride for said STI process on said layer of pad oxide, prior to a core transistor extension implant step.

2. The method of claim 1 where said lightly doped p-type substrate is a p-type epitaxially grown silicon layer on top of a p-type substrate.

3. The method of claim 2 where said p-type epitaxially grown silicon has a resistivity in the range of 1.5-15 ohm-cm.

4. The method of claim 2 where said p-type epitaxially grown silicon has a resistivity in the range of 10-15 ohm-cm.

5. The method of claim 1 where said lightly doped p-type substrate has a resistivity in the range of 10-15 ohm-cm.

6. The method of claim 1 where said oxygen precipitate nucleation step is performed prior to STI pad oxidation.

7. The method of claim 1 where said oxygen precipitate growth step and an STI pad oxidation step are the same process step.

8. The method of claim 1 where said temperature is about 650° C. and said time is about 120 minutes.

9. The method of claim 1 where said temperature is 900° C. and said time is 60 minutes.

10. The method of claim 1 where said oxygen precipitate growth step is performed at 950° C. for 60 minutes in an atmosphere of oxygen diluted with an inert gas.

11. The method of claim 1 where said oxygen precipitate nucleation step forms oxygen precipitates with a concentration greater than about 1 E9/cm3.

12. The method of claim 1 where said oxygen precipitate growth step forms oxygen precipitates with a size greater than about 5 nm.

13. The method of claim 1 where said lightly p-type doped silicon substrate contains approximately 24-28 pmma oxygen and about 1E13-1 E14/cm3 nitrogen.

* * * * *